United States Patent [19]

Haque et al.

[11] Patent Number: 4,598,022
[45] Date of Patent: Jul. 1, 1986

[54] ONE-STEP PLASMA TREATMENT OF COPPER FOILS TO INCREASE THEIR LAMINATE ADHESION

[75] Inventors: Reza Haque, Hamden; Edward F. Smith, III, Madison; Igor V. Kadija, Cheshire, all of Conn.

[73] Assignee: Olin Corporation, New Haven, Conn.

[21] Appl. No.: 707,992

[22] Filed: Mar. 4, 1985

Related U.S. Application Data

[62] Division of Ser. No. 554,465, Nov. 22, 1983, Pat. No. 4,526,806.

[51] Int. Cl.$^4$ .................... B05D 3/06; B05D 5/10
[52] U.S. Cl. .................... 428/413; 428/457; 428/462; 428/473.5; 427/41; 156/272.6
[58] Field of Search ............... 427/41; 428/457, 413, 428/462, 473.5; 156/272.6

[56] References Cited

U.S. PATENT DOCUMENTS

| | | | |
|---|---|---|---|
| 3,518,108 | 6/1970 | Heiss et al. | 427/41 |
| 3,703,585 | 11/1972 | Agnone et al. | 204/298 |
| 3,847,652 | 11/1974 | Fletcher et al. | 427/41 |
| 3,940,506 | 2/1976 | Heinecke | 427/38 |
| 3,944,709 | 3/1976 | Levy | 427/41 |
| 4,013,532 | 3/1977 | Cormia et al. | 427/39 |
| 4,131,691 | 12/1978 | Morley et al. | 427/41 |
| 4,166,784 | 9/1979 | Chapin et al. | 427/39 |
| 4,170,662 | 10/1979 | Weiss et al. | 427/38 |
| 4,226,896 | 10/1980 | Coburn et al. | 427/34 |
| 4,260,647 | 4/1981 | Wang et al. | 427/40 |
| 4,264,642 | 4/1981 | Ferralli | 427/38 |
| 4,374,694 | 2/1983 | Blenner | 156/272.6 |
| 4,391,843 | 7/1983 | Kaganowicz et al. | 427/41 |
| 4,396,450 | 8/1983 | Blenner | 156/272.6 |

OTHER PUBLICATIONS

Shen et al., "A Review of Recent Advances in Plasma Polymerization", *Plasma Polymerization*, American Chemical Society, 1979, pp. 1–33.
CRC Handbook of Chem. and Physics 54th ed., CRC Press, Cleveland Ohio, p. C-234.

*Primary Examiner*—Richard Bueker
*Attorney, Agent, or Firm*—Barry L. Kelmachter; Howard M. Cohn; Paul Weinstein

[57] ABSTRACT

A one-step plasma treatment for improving the laminate adhesion of metallic and non-metallic substrates is described. The treatment comprises forming a plasma of a polar containing organic species and at least one of nitrogen and hydrogen and exposing a substrate material to the plasma for a period of time sufficient to deposit a polymeric film on at least one surface. In a preferred embodiment, a plasma of an azole, nitrogen and-/or hydrogen is utilized. The process has particular utility in forming adherent polymeric films on one or more surfaces of copper and copper alloy foils to be used in printed circuit applications.

7 Claims, 2 Drawing Figures

ONE-STEP PLASMA TREATMENT OF COPPER FOILS TO INCREASE THEIR LAMINATE ADHESION

This application is a division of application Ser. No. 554,465, filed Nov. 22, 1983, now U.S. Pat. No. 4,526,806.

This application is related to co-pending U.S. patent application Ser. No. 554,466, filed on an Nov. 22, 1983, to Hague et al. for a THREE-STEP PLASMA TREATMENT OF COPPER FOILS TO ENHANCE THEIR LAMINATE ADHESION, now U.S. Pat. No. 4,524,089.

This application is directed to the production of treated copper foil for use in electronic devices.

Printed circuit boards are currently used as the substrate materials in a wide variety of electronic devices. Typically, these boards are fabricated from a thin sheet of copper foil laminated to either a fiberglass/epoxy hardboard or, in some cases, flexible plastic substrates. During the latter stages of fabrication, the majority of the copper foil is etched away to provide the desired interconnecting circuitry between various components in an electronics circuit design. With improvements in etching technology, it is currently possible to achieve intercircuit line spacing approaching 3 to 5 mils. Minimum line spacing is one of the current technical limitations to continued miniaturization of complex circuits. As the minimum line spacing is reduced, a higher density component packing is permitted on a circuit board. Attempts to further reduce the minimum line spacing have become limited by the physical characteristics of the copper foil.

Generally, copper foil is produced by either electrodeposition or a rolling technique. In both cases, the resultant surface of the foil is not readily amenable to producing adequate bond strength after lamination. As a result, all foil must be treated by an additional electrochemical process to improve its bondability. The most common electrolytic techniques currently used to improve the adhesion of copper foils are directed to the production of dendritic surfaces on the copper foil. The dendritic surfaces improve adhesion by contributing to mechanical interlocking between the copper foil and the substrate. However, the dendritic or roughened surfaces can for specific applications unfavorably affect the performance characteristics of the foil. For example, line spacing in the selective etching of copper foils could be adversely affected. Further, the degree of attenuation and the speed of transmission of high frequency signals could also be adversely affected. In view of this, a treatment that yields a copper foil with improved adhesion without increasing the overall surface roughness is most desirable.

Some interest in using substrates having relatively smooth polymer film coatings for printed circuit applications has been expressed in the prior art. polymer coatings are particularly advantageous because they can serve as capacitor dielectrics, insulators, and/or protective layers. A variety of different approaches including sputtering and ion implantation have been tried in an attempt to coat various metallic and non-metallic substrate materials with polymer films. U.S. Pat. Nos. 3,703,585 to Agnone et al. and 4,264,642 to Ferralli illustrate some of these different approaches.

The technique for forming polymer films that has drawn the most attention is the glow discharge plasma technique. It has been found that polymer films formed using this technique have unique physical properties and tend to be relatively thin and substantially pinhole-free. Most glow discharge plasma treatment techniques consist of placing a substrate to be coated in a plasma in a surrounding chamber and injecting a particular gas such as a monomer into the chamber. The type of gas injected into the chamber normally depends upon the type of polymer coating to be deposited on the substrate. U.S. Pat. Nos. 3,518,108 to Heiss, Jr. et al., 4,013,532 to Cormia et al., 4,131,691 to Morley et al., 4,166,784 to Chapin et al., 4,170,662 to Weiss et al. and 4,226,896 to Coburn et al. and the article "A Review of Recent Advances in Plasma Polymerization" by Mitchel Shen et al., *Plasma Polymerization*, American Chemical Society, 1979 illustrate some of the plasma polymerization treatments that have been used in the prior art.

While most glow discharge treatments inject a single gas into the chamber in which the plasma is formed, it is also known to deposit a polymer coating on a substrate by placing the substrate in a plasma containing a mixture of gases. In U.S. Pat. No. 3,940,506 to Heinecke, a process is described for selectively treating a surface of an article comprising silicon in part and either silica or silicon nitride in part by placing the article in a plasma containing fluorine, carbon and a reducing species such as trifluoromethane to deposit a fluoropolymer coating on the article.

In yet another glow discharge plasma treatment process, an amorphous continous layer of $SiO_x$ is deposited onto a substrate in a series of thin layers by glow discharge of an organosilane and oxygen, interrupting the deposition as required, and initiating a glow discharge in oxygen after each interruption and prior to each subsequent deposition. U.S. Pat. No. 4,260,647 to Wang et al. illustrates this type of approach.

In accordance with the present invention, a one-step plasma treatment for depositing a polymer film coating on a substrate material to enhance its laminate adhesion is provided. The treatment comprises exposing a substrate material to be coated to a plasma of a mixture of a polar containing organic species and at least one of nitrogen and hydrogen. The polar containing organic species used in the treatment should be one that forms a stable compound with the substrate material. While the process of the present invention has wide applicability, it has been found to have particular utility in depositing relatively smooth polymeric film coatings on copper and copper alloy foils.

The process of the present invention may be performed using an evacuable chamber in which two spaced apart electrodes and a substrate material to be coated are located. A source of a polar containing organic species that forms a stable compound with the substrate material may be placed in close proximity to or in contact with one of the electrodes. While the organic species may have any desired form, good results can be obtained using an organic species that is in powder form. The substrate material to be coated is placed between the two electrodes, preferably in close proximity to the polar containing organic species source. The chamber is first evacuated to a desired base pressure and is then permitted to stabilize at a desired working pressure for a desired period of time. Thereafter, a current at a desired frequency and a desired power level is supplied to the electrodes to create an initial plasma. This initial plasma causes the rate of volatilization of the organic species to increase. After the desired working pressure has been reached, at least one of nitrogen and hydrogen is introduced into the chamber. In a preferred manner of performing the process of the present invention, nitrogen and hydrogen gas are simultaneously introduced into the chamber. Since introduction of the gas or gases tends to increase the total pressure in the chamber, valve means connected to a vacuum pump used to evacuate the chamber is opened to reduce the total pressure in the chamber to said desired working pressure. The substrate material is exposed to the plasma of the organic species and the nitrogen and/or hydrogen for a time period sufficient to deposit a relatively smooth polymer film coating on at least one surface of the substrate.

In performing the process of the present invention, a quantity of the organic species sufficient to maintain a vapor pressure equal to the desired working pressure should be placed in the chamber. It has been found that a suitable working pressure is in the range of about 10 mtorr to about 100 mtorr, preferably from about 20 mtorr to about 30 mtorr. It has also been found to be desirable to use an azole such as benzotriazole, toluenetriazole, N-vinyl carbazole and acetyl carbazole as the organic species. Of course, the foregoing list of azoles is illustrative and other azoles and other chemicals could be used as the organic species.

Where the plasma contains both nitrogen and hydrogen gas, it is preferred to introduce both gases simultaneously with a desired flow rate ratio. The ratio of the nitrogen gas flow rate to the hydrogen gas flow rate may be in the range of about 0.1:1 to about 10:1. Preferably, it is in the range of about 1:1 to about 3:1. Alternatively, the nitrogen and hydrogen could be introduced into the plasma using compounds such as ammonia, ethyl amines and methyl amines either in gas or liquid form.

It has been found that the process of the present invention is capable of depositing a relatively smooth polymer film coating having a thickness of about 50 Å to about 10,000 Å onto a substrate material. While the nature of the coating will depend upon the type of organic species used and whether both nitrogen and hydrogen are used, it has been found that the deposited coating exhibits improved adhesion. It is believed that the improved adhesion is attributable to the coating having a polar nature. This polar nature permits relatively strong chemical bonds to be formed when the substrate is laminated to another material such as the non-metallic materials typically used in printed circuit applications.

The process of the present invention may be performed in a batchwise manner or in a continuous or semi-continuous manner. After the one-step treatment has been completed, the polymer coated substrate material may be laminated to another material. For example, the polymer coated substrate material may be laminated to a fiberglass epoxy material in the case of printed circuit boards or to a polyimide in the case of flexible circuits.

It is an object of the present invention to provide a process for treating a substrate material to improve its bondability.

It is a further object of the present invention to provide a process as above for forming an adhesive polymeric coating on one or more surfaces of a substrate material.

It is still a further object of the present invention to provide a process as above for treating metal foil such as copper foil with a polymer coating to improve its laminate adhesion.

These and other objects will become apparent from the following description and drawings in which like reference numerals designate like elements.

Figure 1:
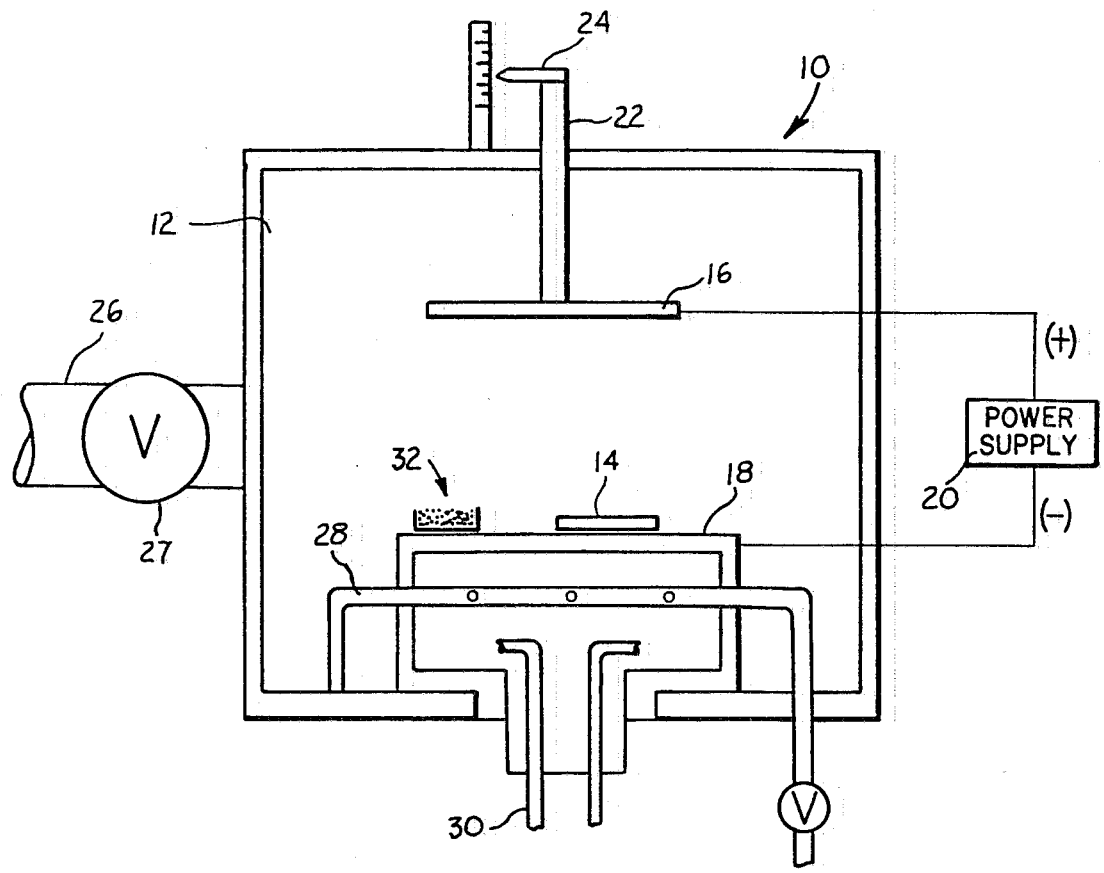
FIG. 1 is a schematic illustration of an apparatus that can be used to perform the process of the present invention.

In accordance with the present invention, a process for depositing a polymer film coating on at least one surface of a substrate material for improving the laminate adhesion of the substrate material is provided. While the following description describes the invenion in the context of forming a polymer film on copper foil, the process of the present invention has wide applicability in treating other metal and metal alloy substrates as well as treating non-metallic substrates. Furthermore, while the invention will be described as a batch operation, it can be used as part of a continuous or semicontinuous operation.

Referring now to the Figures, the apparatus 10 includes a vacuum chamber 12 in which the polymerization of the substrate material 14 takes place. In the vacuum chamber are two electrodes 16 and 18, generally an anode 16 and a cathode 18. The electrodes 16 and 18 are both connected to an external power source 20 which may be either any suitable conventional DC source or any suitable conventional AC source known in the art. An AC source is preferred because films deposited from DC glow discharge systems are generally poor and difficult to reproduce. The electrodes 16 and 18 can be a screen, coil or plate formed from any suitable electrical conductor such as stainless steel, platinum or graphite. When an AC power source is used, the electrodes 16 and 18 may also be formed from dielectric materials.

In using an AC power supply, a current at a desired frequency and a desired power level is supplied to the electrodes. Both the frequency and the power level can be varied over a broad range as is well known to those skilled in the art.

If desired, the anode 16 may be adjustable. Suitable means 22 for adjusting the position of the anode relative to the cathode may be provided. There may also be an indicator 24 for displaying the separation between the anode and cathode. Generally, the electrodes 16 and 18 are spaced from about 2" to about 6" apart. In those situations where the frequency is other than a radio frequency, one or more magnets not shown may be mounted on the electrodes 16 and 18 to enhance the plasma.

The chamber 12 has an outlet 26 which permits evacuation of the interior of the chamber. The outlet 26 may be connected through valve means 27 to any suitable conventional vacuum pump system (not shown) known in the art for evacuating the chamber 12 to a desired base pressure and for maintaining pressure within the chamber at a desired working pressure level. The valve means 27 may comprise any suitable valve or valve arrangement known in the art.

The chamber 12 also has means 28 for introducing a gas or a mixture of gases into the chamber interior. The gas supply means 28 may comprise any suitable means known in the art such as a gas distribution ring or one or more conduits opening into the chamber interior. The gas supply means 28 may be connected through suitable ducting and valve arrangements not shown to one or more gas sources such as one or more gas containers not shown. If a plurality of gas conduits are used in lieu of a gas distribution ring, each gas conduit can be connected to an individual gas source. Any suitable valve arrangement sufficient to permit regulation of the mass and/or volume flow rate of each gas flowing into the chamber interior may be provided as part of the gas supply means. If desired, a pressure indicating device not shown such as a capacitance manometer may be used to indicate the pressure level inside the chamber.

If desired, the chamber 12 may also be provided with means 29 for heating the interior and/or means 30 for cooling the interior. The heating means 29 may comprise any suitable means known in the art such as a resistance coil. The cooling means 30 may also comprise any suitable means known in the art such as a water cooling loop. If needed, means not shown for independently heating the substrate material to be coated and/or either electrode may also be provided.

To perform the process of the present invention, a polar containing organic species source may be placed inside the chamber 12. Generally, the organic species source is either in close proximity to or grounded to the electrode 18. If the organic species source is placed in close proximity to but spaced from the electrode 18, means not shown for independently heating the source may be provided. This independently heating approach is believed to permit vaporization of the organic species at lower power levels.

The organic species may be in any desired physical condition. For example, it may be in solid form, in powder form, in gaseous form, or in liquid form. The process of the present invention can be performed using a powdered organic species placed in a dish, pan or other container 32 on the electrode 18. In lieu of this, an organic species in gaseous form may be supplied to the interior of the chamber 12 from an external supply not shown. If this latter approach is used, it may be necessary to deliver the gaseous organic species to the chamber interior through a heated manifold not shown to prevent crystallization of the organic species.

The amount or quantity of the organic species present in the chamber 12 should be sufficient to maintain a vapor pressure during plasma production substantially equal to a desired working pressure. It has been found to be desirable to have sufficient organic species material to maintain a vapor pressure of about 10 mtorr to about 10 mtorr, preferably from about 20 mtorr to about 30 mtorr.

The type of organic species used will of course depend upon the type of substrate material 14 to be coated and the type of adherent coating to be formed. The organic species selected should be compatible with the substrate material so as to form a stable compound. For substrates formed from copper and copper alloys, it has been found to be desirable to use an azole such as benzotriazole or toluenetriazole as the organic species. Other azoles including n-vinyl carbazole and acetyl carbazole and other chemicals with groups known to have a preference for combining with the substrate material, e.g. copper such as acetyl acetone and 9-acetyl anthracene may also be used.

As previously mentioned, the organic species in any suitable form, such as in powder form, may be placed in a dish 32 on the electrode 18. The substrate material 14 is then placed in close proximity to the dish 32. While the substrate material 14 may have any suitable position with respect to the organic species source, it has been found that the closer the substrate material 14 is to the organic species source, the better the adhesion properties of the coated substrate materials. It appears that it is desirable to position the substrate material 14 from about 1 mm. to about 100 mm., preferably from about 1 mm. to about 30 mm., from the organic species source 32. If desired, the substrate material 14 may also be placed on the electrode 18. If the organic species source 32 and the substrate material 14 are placed in close proximity to but not contacting the electrode 18, any suitable means known in the art may be used to position them in the desired location. It also appears to be desirable to have the organic species introduced in the same plane as the substrate material is provided.

Prior to being placed in the chamber 12, the substrate material 14 may be cleaned using any suitable cleaning technique known in the art. Of course, the type of cleaning technique used will depend upon the nature of the material forming the substrate and the type of contaminants to be found on the material. For example, where the substrate material comprises a foil made from a copper alloy such as copper alloy C11000, the substrate material may be cleaned using sulfuric acid, water and acetone.

The process is begun by evacuating the chamber 12 to a desired base pressure. It has been found that evacuating the chamber to an initial pressure below about $10^{-5}$ torr is desirable. After the chamber has had an opportunity to stabilize at a desired working pressure a current at a desired frequency and a desired level of power are supplied to the electrodes 16 and 18 by the external power source 20. The current to the electrodes 16 and 18 is preferably supplied at a freuqency in the range of about 10 kilohertz to about 20 gigahertz. Most preferably, the current frequency is within the range of radio frequencies and may be from about 1 megahertz to about 100 megahertz. A frequency of about 13.56 MHz has been found to be particularly useful. Since the power level needed to achieve the desired deposition characteristics appears to be dependent upon the geometry of the deposition equipment, it appears to be meaningful to describe the power in terms of power per electrode area (watts/in$^2$) and/or power per contained plasma volume (watts/in$^3$). In the apparatus of FIG. 1, the contained plasma volume is defined by the electrodes 16 and 18 in the chamber 12. The process of the present invention may be carried out using a level of power per electrode area in the range of about 2.45 watts/in$^2$ to about 14.8 watts/in$^2$ and/or a level of power per contained plasma volume in the range of about 0.44 watts/in$^3$ to about 2.65 watts/in$^3$. Preferably, the level of power per electrode area is in the range of about 4.9 watts/in$^2$ to about 10 watts/in$^2$ and/or the level of power per contained plasma volume in the range of about 0.88 watts/in$^3$ to about 1.75 watts/in$^3$.

The power and current supplied to the electrodes 16 and 18 cause a plasma to be created in the chamber 12. This initial plasma in turn causes heating of the electrode 18 and vaporization or volatilization of at least some of the powder organic species. To maintain the vapor pressure in the chamber 12 at the desired pressure level in the range of about 10 mtorr to about 100 mtorr, preferably from about 20 mtorr to about 30 mtorr, a valve means 27 connected to the vacuum pump system not shown is provided. The pressure in the chamber 12 may be controlled by opening and closing the valve means 27.

After the vapor pressure of the organic species has stabilized at the desired pressure level, at least some nitrogen, preferably in gaseous form, is introduced into the chamber 12. In a preferred manner of performing the present invention, both nitrogen and hydrogen gas are introduced simultaneously into the chamber 12 through gas supply means 28. Since the introduction of nitrogen and/or hydrogen into the chamber tends to increase the total pressure within the chamber, the valve means 27 may be regulated to reduce and/or maintain the total working pressure in the aforementioned desired pressure range.

It has been found to be desirable to control the gas supply means 28 so that the total gas flow rate of nitrogen and/or hydrogen into the chamber 12 is within the range of about $10^{-3}$ standard cubic centimeters/liter/minute to about 10 standard cubic centimeters/liter/minute. Preferably, the total gas flow rate is in the range of about $10^{-1}$ standard cubic centimeters/liter/minute to about 1 standard cubic centimeters/liter/minute. However, if only nitrogen gas is being introduced, the upper limit of the preferred range may be raised to about 2 standard cubic centimeters/liter/minute. Where both nitrogen and hydrogen gas are being introduced into the chamber 12, the ratio of the flow rate of nitrogen to the flow rate of hydrogen may vary from about 0.1:1 to about 10:1. Preferably, the ratio of the nitrogen to hydrogen flow rate is in the range of about 1:1 to about 3:1.

If desired, a single compound containing both nitrogen and hydrogen may be introduced into the chamber 12 in lieu of separate nitrogen and hydrogen gas flows. For example, compounds like ammonia, ethyl amines and methyl amines in either gas or liquid form may be used in lieu of the nitrogen and hydrogen gases.

The substrate material 14 is exposed to the plasma of the organic species and the nitrogen and/or hydrogen for a time period sufficient to deposit the polymer film coating. It has been found that suitable exposure times range from about 1 second to about 30 minutes, preferably from about 0.1 minute to about 15 minutes. It is desirable during the deposition period to maintain the temperature in the vicinity of the substrate within a temperature range of from about room temperature to about 300° C. The temperature may be maintained using the heating means 29 and/or the cooling means 30.

It has been found using the process of the present invention that a relatively pinhole-free polymer film coating having a thickness of about 50 Å to about 10,000 Å can be deposited on the exposed surface or surfaces of the substrate. The polymer film coating deposited by the process of the instant invention generaly exhibits a polar character that is particularly useful in forming strong chemical bonds to non-metallic materials such as epoxy. By the term "polar character," it is meant that the film has a sort of preferred orientation that permits the creation of strong chemical bonds between the coated substrate and a laminating material. It has also been found that the process of the present invention permits rapid deposition of high strength adhesive coatings.

After the polymer film coating has been deposited onto the substrate material 14, the coated substrate material may be removed from the chamber 12 and laminated to a desired material. The desired material may be either metallic or non-metallic. For example, the material may be an adhesively coated plastic film such as Mylar, a polyimide or an epoxy material. Any suitable lamination or bonding process known in the art may be used to bond the coated substrate material to the desired material.

To demonstrate the process of the present invention, the following tests were performed.

EXAMPLE I

Figure 2:
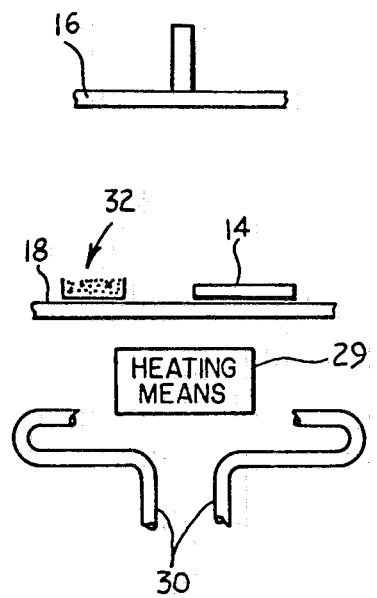
FIG. 2 is an exploded view of a portion of the apparatus of FIG. 1.

Samples of wrought copper alloy C11000 foil were first cleaned using a sulfuric acid, water and acetone cleaning solution and placed in a vacuum chamber similar to the one shown in FIGS. 1 and 2. Approximately 2 grams of toluenetriazole in powder form was placed in a gas dish on the cathode. After the substrate and the toluenetriazole were positioned in the chamber, the chamber was evacuated to a base pressure of $10^{-5}$ torr. After stabilizing at the desired working pressure, a power per cathode area level of 10 watts/in$^2$ and a current at a frequency of 13.56 MHz were supplied to the electrodes to create a plasma in the chamber 12. The vapor pressure within the chamber was maintained at about 25 mtorr. Hydrogen and nitrogen gas were introduced into the chamber each at a flow rate of about 0.118 standard cubic centimeters/liter/minute. Total pressure in the chamber was maintained at about 25 mtorr. The chopper foil material was exposed to the plasma of toluenetriazole, hydrogen and nitrogen for approximately 10 minutes. At the end of the run, the temperature in the vicinity of the substrate and the cathode area of the chamber 12 was approximately 100° C.

Each copper sample treated by the above procedure was then laminated to FR-4 epoxy preimpregnated fiberglass cloth using the lamination process recommended by the manufacturer for the manufacture of rigid epoxy printed circuit boards. After lamination, the degree of adhesion or peel strength was measured by using a peel test in accordance with appropriate IPC standards. The treated copper foil samples exhibited peel strengths in the range of about 12 to 16 lb/in width. It was also discovered during this test that only approximately 0.2 grams of the toluenetriazole evaporated during the experiment.

EXAMPLE II

To demonstrate the effect on laminate adhesion of different placements of the substrate relative to the organic species source, the following test was conducted. Samples of wrought copper alloy C11000 foil were first cleaned as in Example I. One of the samples was placed on the anode, one of the samples was placed on the cathode adjacent the organic species source, and another sample was spaced between the anode and cathode approximately 2 inches from the cathode. The anode and cathode were spaced apart approximately 4 inches. All of the test parameters and conditions were the same as in Example I except that in lieu of introducing both nitrogen and hydrogen gas into the chamber, only nitrogen gas at a flow rate of about 0.618 standard cubic centimeters/liter/minute was introduced into the chamber. The test procedure was identical to that in Example I.

As in Example I, each treated copper sample was laminated in FR-4 epoxy preimpregnated fiberglass cloth and subjected to a peel test. For comparison purposes, a piece of untreated copper alloy C11000 foil was laminated to FR-4 epoxy preimpregnated fiberglass cloth and subjected to a peel test. The results are reported to Table I.

TABLE I

| Sample | Location | Peel Strength (lbs/in width) |
| --- | --- | --- |
| Treated C11000 | anode | 3.5 |
| Treated C11000 | plasma | 4.0 |
| Treated C11000 | cathode | 8.0 |
| Untreated C11000 | — | 4.0 |

This test also demonstrates that the process of the present invention can be performed using an organic species and nitrogen gas plasma without any hydrogen gas.

EXAMPLE III

For comparison purposes, copper alloy C11000 foil samples were immersed in aqueous toluenetriazole and benzotriazole solutions without any plasma treatment. The aqueous toluenetriazole and benzotriazole solutions contained about 0.1 w/o toluenetriazole and about 0.1 w/o benzotriazole, respectively. Each sample was immersed in one of the solutions for about 10 seconds, dried, laminated to a FR-4 epoxy preimpregnated fiberglass cloth, and subjected to a peel test. The samples each exhibited a peel strength of about 4.5 lbs/in width.

EXAMPLE IV

To further show the improvements obtained by using the process of the present invention, copper alloy C11000 foil samples and FR-4 epoxy board samples were exposed to toluenetriazole and benzotriazole vapors without any plasma treatment. Each sample was placed in a closed container containing either toluenetriazole or benzotriazole vapor at about 200° C. for about 3 seconds. The toluenetriazole or benzotriazole vapors were produced by heating toluenetriazole or benzotriazole in powder form to a temperature of about 200° C.

Each sample was then laminated to FR-4 epoxy board and subjected to a peel test as in the other examples. For comparison purposes, a FR-4 epoxy sample not exposed to any vapor was laminated to another FR-4 epoxy board and subjected to the same peel test. As can be seen from Table II, none of these samples exhibited a peel strength greater than about 4.5 lbs/in width.

TABLE II

| Sample | Vapor | Peel Strength (lbs/in width) |
| --- | --- | --- |
| C11000 foil | TTA | 4.5 |
| C11000 foil | BTA | 4.5 |
| FR-4 epoxy | BTA | 3.5 |
| FR-4 epoxy | BTA | 3.5 |
| FR-4 epoxy | TTA | 4.0 |
| FR-4 epoxy | — | 4.0 |

Examples III and IV are believed to illustrate that non-plasma polymerized benzotriazole and toluenetriazole films do not act as well as the plasma deposited films of the present invention for printed circuit board lamination.

While the present invention has been described in terms of a particular plasma deposition equipment, it should be generally applicable to a wide range of such equipment. It is believed, however, that the operational ranges described above for the various processing variables may be strongly dependent upon the specific geometry of deposition equipment. Therefore, with a change in equipment, results similar to those described hereinbefore may be obtained outside the aforementioned processing limits.

While the invention has been illustrated in the context of applying a polymer film coating to a copper substrate, it is believed that similar polymeric film coatings for improving laminate adhesion could be deposited on substrates formed from other copper alloys, other metal and metal alloy materials and nonmetallic materials such as silica using the process of the present invention. For example, the process of the present invention could be used to form polymer film coatings on metals such as aluminum, titanium, tantalum, molybdenum and alloys thereof.

While the invention has been illustrated in the context of forming a coated substrate material for use in printed circuit applications, it is believed that the coated substrate materials could be used in other applications. For example, the polymeric film coating could be applied to a suitable substrate material to protect the substrate material from the environment, moisture, chemical attack and mechanical damage. It may be possible to use the plasma polymerized coatings on the substrate as an adhesion primer for subsequent coatings such as paint.

While it has been suggested that the nitrogen and hydrogen gases are to be introduced simultaneously into the chamber 12, it is possible to introduce them sequentially if it is so desired.

While the invention has been described in terms of a batchwise technique, the process may also be used on a continuous or semi-continuous operation. If used in continuous or semi-continuous operation, the chamber 12 should be provided with suitable seals for maintaining the vacuum and the vapor pressures within the desired pressure limitations.

While the plasma forming the chamber 12 is generally used to heat the electrode 18, the electrode 18 could also be heated independently by the heating means 29.

If the organic species is supplied to the chamber 12 in gaseous form, it can be premixed with nitrogen and/or hydrogen gas if so desired. If the gases are premixed, the gases can be directed toward the substrate material instead of just fed into the chamber 12.

Depending upon the position of the substrate relative to the electrodes, the polymeric film coating may be deposited on either one surface or a plurality of surfaces of the substrate. If it is desired to deposit the polymeric coating on only one side while the substrate is in an ungrounded condition, two substrates can be placed adjacent one another so that the adjacent substrate faces are not coated.

The plasma polymerization technique of the present invention has the distinct advantage of replacing the mechanical bond of typical dendritic structure approaches with direct chemical bonds. Therefore, by using this approach, it is no longer necessary to alter the topography of a metal or metal alloy foil to be used in a printed circuit application. The plasma polymerization approach described herein will work equally well on flat or irregular topographies. The advantage of a flat metal or metal alloy foil is that it permits easier etching with very fine line spacing. With current dendritic surface treated foils, the etching process must overcome a very irregular interface where the metal meets the epoxy. For very fine line spacing, the irregular thickness of the foil makes it difficult to adequately control the lateral etching process. In order to insure adequate circuit separation, the etching process must be designed to remove the maximum thickness of the metal foil. This could result in over-etching or undercutting of the circuit paths in the thinner portions of the foil. Over-etching leads to variations in the circuit width and undercutting acts to reduce the area of contact between the metal foil and the printed circuit board material.

With the present invention, most if not all of the problems associated with point-to-point topographical differences can be avoided. The plasma polymerized layer can be applied to flat stock. This should lead to a far more uniform etching response for the final product and potentially allow closer circuit spacing and uniformly thinner circuit lines. Additionally, by the use of chemical bonding instead of mechanical bonding, somewhat higher peel strengths can be achieved between the foil and the printed circuit board material.

While most of the above discussion applies to epoxy hardboard substrates, these comments could also be directed towards flexible printed circuit applications. Flexible printed circuits use either an adhesively coated plastic film such as Mylar or polyimide films as a substrate. The present invention would again allow direct chemical bonding between the plasma polymerized film and the adhesive layer. However, since there is no longer direct contact with the metal foil, a wider variety of adhesives could be considered in an effort to provide either higher bond strengths or a wider range of service conditions, e.g. higher temperatures. It is also possible that by proper selection of the polymerized film it may be possible to bond directly flexible substrates and eliminate the adhesive.

Instead of using an organic species source separate from the substrate material to be coated, the process of the present invention may be performed using a substrate material precoated on one or more surfaces with an organic species. The precoating of the substrate material may take place before the substrate material is placed in the chamber.

The patents and article set forth in this specification are intended to be incorporated by reference herein.

It is apparent that there has been provided in accordance with this invention a one-step plasma treatment of copper foils to increase their laminate adhesion which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. An article having improved laminate adhesion, said article comprising:
    a copper or copper alloy foil having a plasma deposited polymeric film coating exhibiting polar characteristics on at least one surface;
    said film being formed from a feedstock that forms an electropositive species, said feedstock comprising a polar containing organic species and at least one of nitrogen and hydrogen; and
    said film being formed by the process of:
    (a) forming a plasma of said feedstock; and
    (b) exposing said copper or copper alloy foil to said plasma for a period of time sufficient to deposit said polymeric film on said at least one surface.

2. An article having improved laminate adhesion, said article comprising:
    a metal or metal alloy foil having a plasma deposited polymeric film coating exhibiting polar characteristics on at least one surface; and
    said film being formed by the process of:
    (a) forming a plasma of a polar containing organic species selected from the group consisting of benzotriazole, toluenetriazole, acetyle acetone, N-vinyl carbazole, acetyl carbazole, 9-acetyl anthracene and mixtures thereof and at least one of nitrogen and hydrogen; and
    (b) exposing said foil to said plasma for a period of time sufficient to deposit said polymeric film on said at least one surface.

3. A composite article comprising:
    a metal or metal alloy foil having a plasma deposited polymeric film coating on at least one surface, said coating exhibiting polar characteristics for providing improved laminate adhesion; and
    a layer of plastic material bonded to said at least one foil surface on which said polymeric film is deposited.

4. The article of claim 3 further comprising:
    said foil being formed from copper or a copper alloy.

5. The article of claim 3 further comprising:
    said polymeric film being formed from a feedstock capable of forming an electropositive species.

6. The article of claim 3 further comprising:
    said plastic material layer being formed from a fiberglass epoxy material.

7. The article of claim 3 further comprising:
    said plastic material layer being formed from a polyimide material.

* * * * *